United States Patent [19]

Agrawal et al.

[11] Patent Number: 5,093,920
[45] Date of Patent: Mar. 3, 1992

[54] PROGRAMMABLE PROCESSING ELEMENTS INTERCONNECTED BY A COMMUNICATION NETWORK INCLUDING FIELD OPERATION UNIT FOR PERFORMING FIELD OPERATIONS

[75] Inventors: Prathima Agrawal, Union County, N.J.; William J. Dally, Middlesex County, Mass.; Anjur S. Krishnakumar, Somerset County, N.J.

[73] Assignee: AT&T Bell Laboratories, Murray Hill, N.J.

[21] Appl. No.: 408,459

[22] Filed: Sep. 15, 1989

Related U.S. Application Data

[63] Continuation of Ser. No. 66,921, Jun. 25, 1987, abandoned.

[51] Int. Cl.[5] .................. G06F 9/00; G06F 13/00; G06F 15/16
[52] U.S. Cl. .................. 395/800; 364/229; 364/232.3; 364/240.2; 364/242.94; 364/259.8; 364/284.4; 364/931.4; 364/933.8; 364/DIG. 1
[58] Field of Search ... 364/200 MS File, 900 MS File

[56] References Cited

U.S. PATENT DOCUMENTS

| | | | |
|---|---|---|---|
| 4,430,699 | 2/1984 | Segarra | 364/200 |
| 4,644,461 | 2/1987 | Jennings | 364/200 |
| 4,656,580 | 4/1987 | Hitchcock et al. | 364/200 |
| 4,811,214 | 3/1989 | Nosenchuck et al. | 364/200 |
| 4,819,150 | 4/1989 | Jennings et al. | 364/200 |
| 4,837,676 | 6/1989 | Rosman | 364/200 |
| 5,016,163 | 5/1991 | Jesshope et al. | 364/200 |

OTHER PUBLICATIONS

Miron Abramovici et al., "A Logic Simulation Machine", IEEE, vol.-CAD-21 No. 2, Apr. 1983.
W. Hillis, "The Connection Machine", pp. 82-91.
Scientific American, Jun. 1987, pp. 108-115.
Miron Abramovici et al., "A Logic Simulation Machine", IEEE, vol.-CAD-2, No. 2, Apr. 1983.
M. Abramovici et al., "A Logic Simulation Machine", IEEE, vol.-CAD-2, No. 2, Apr. 1983, pp. 82-91.
"A Survey of Hardware Accelerators used in Computer-Aided Design", *IEEE Design Test of Computers*, Tom Blank, Aug. 1984.
"Hardware Acceleration of Logic Simulation using a Data Flow Architecture", *IEEE* 1985, Gary Catlin et al.
"Silicon Solutions Carves Niche in VLSI Design" *Electronics*, Aug. 12, 1985.
"Powerspice Simulates Circuits Faster and More Accurately" *Electronics*, Aug. 26, 1985.
"A Hardware Architecture for Switch-Level Simulation" *IEEE* 1985, William J. Dally et al.
"The Connection Machine", *Scientific American*, W. D. Hillis, Jun. 1987, pp. 108-115.

*Primary Examiner*—Thomas C. Lee
*Assistant Examiner*—Ayni Mohamed
*Attorney, Agent, or Firm*—H. T. Brendzel

[57] ABSTRACT

An arrangement for implementing graph operations, generally, and circuit simulations in particular employing a plurality of substantially identical high speed special purpose processing elements (PE) that are flexibly interconnected through a switch to form a cluster. In addition to the processing element (PE) being programmable, the interconnection switch permits dynamically altered routing of signals between the processing elements. The processing elements include a queue unit which permits high speed asynchronous communication between the elements. Additional advantage is attained with a hierarchical arrangement where a plurality of clusters are interconnected in an n-cube arrangement, and all of the clusters communicate with a host computer.

6 Claims, 7 Drawing Sheets

PROGRAMMABLE PROCESSING ELEMENTS INTERCONNECTED BY A COMMUNICATION NETWORK INCLUDING FIELD OPERATION UNIT FOR PERFORMING FIELD OPERATIONS

This application is a continuation of application Ser. No. 066,921, filed on June 25, 1987, now abandoned.

BACKGROUND OF THE INVENTION

This invention relates to special purpose high speed processors, commonly called hardware accelerators, which are used for computer simulations generally, and computer simulation of circuit designs in particular.

Hardware accelerators are special purpose processing apparatus that are designed specifically for an efficient realization of a particular algorithm or a class of algorithms. These elements are becoming increasingly popular as viable solutions to a wide range of computer-aided design problems, and their use has resulted in notable performance improvements. With present day simulation elements it is possible to perform over $10^6$ gate evaluations per second. This is orders of magnitude improvement over software logic simulations.

Simulation elements achieve their high level of performance through one or more of the following means: duplication of identical hardware units among which the simulation problem is divided, pipelining of the operations through the units, dedicated logic tailored to the application at hand, and dedicated interconnections between the processing units. A useful survey of hardware accelerators is presented in "A Survey of Hardware Accelerators used in Computer-Aided Design," Tom Blank, IEEE Design and Test of Computers, August 1984. Also instructive are "A Logic Simulation Machine", Miron Abramovici, IEEE, Vol-CAD-2, No. 2, April 1983; "Hardware Acceleration of Logic Simulation using a Data Flow Architecture", IEEE 1985; "Silicon Solutions Carves Niche in VLSI Design", Electronics, Aug. 12, 1985; "Powerspice Simulates Circuits Faster and More Accurately", Electronics, Aug. 26, 1985; and "A Hardware Architecture for Switch-Level Simulation" W. J. Dally et al., IEEE 1985.

Most of the hardware accelerators described in these prior art systems contain many processing elements, or elements, that are tailored to perform specific tasks very efficiently, and these elements are interconnected to form a cohesive, interacting system. The failings shared by all of the known simulation elements are that they employ fixed interconnections between the processing elements, which reduces their flexibility, and that the processing elements themselves are tailored to the particular application to such an extent that it is necessary to use different designs when a different application is contemplated.

SUMMARY OF THE INVENTION

This invention attains substantial advantages over the prior circuit simulation art by employing a plurality of substantially identical high speed special purpose processing element (PE) that are flexibly interconnected through a switch to form a cluster. In addition to the processing element (PE) being programmable, the interconnection switch permits dynamically altered routing of signals between the processing elements. The processing elements include a queue unit which permits high speed asynchronous communication between the elements. Additional advantage is attained with a hierarchical arrangement where a plurality of clusters are interconnected in an n-cube arrangement, and all of the clusters communicate with a host computer.

DETAILED DESCRIPTION

Figure 1:
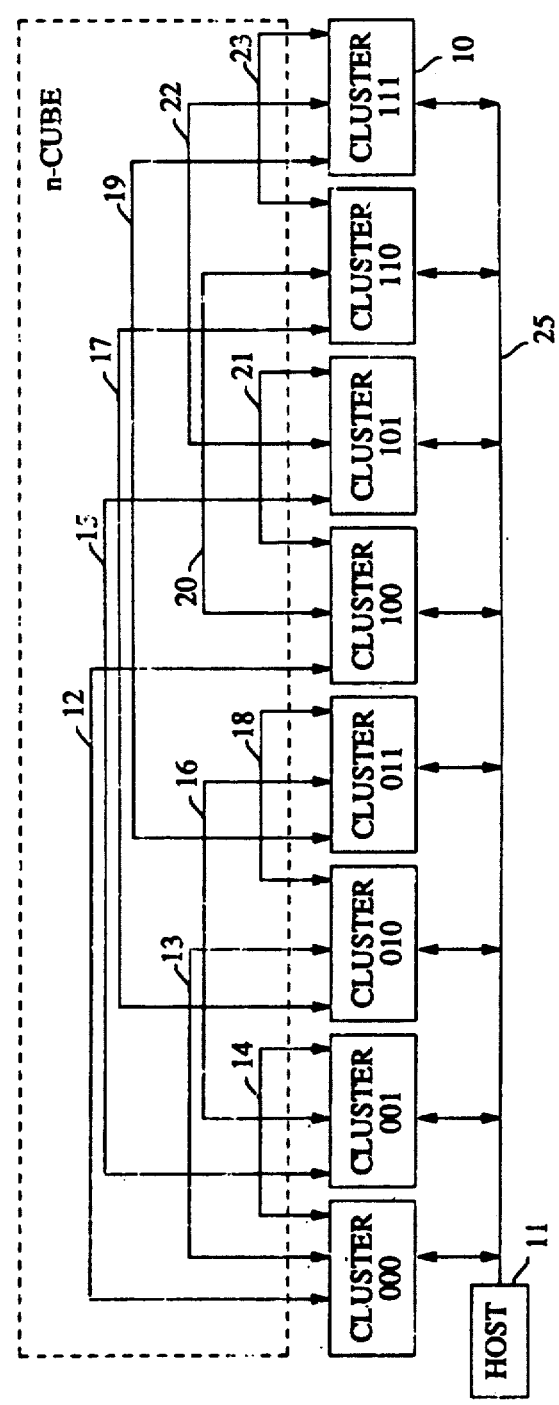
FIG. 1 presents a 3-cube communications network with 8 clusters connected to each node and communicating with a host computer through a separate bus.

FIG. 1 presents a general block diagram of our Microprogrammable Accelerator for Rapid Simulation (MARS). It includes eight clusters 10 and a host computer 11 that are interconnected in a Boolean 3-cube via bi-directional lines 12-24. They are also interconnected via a common two directional bus 25. Each of the clusters has a binary address that may correspond, for example, to the coordinates of the cluster on the n-cube (in n-space). Although FIG. 1 depicts a 3-cube interconnection, the extension to a Boolean 4-cube (with 15 processing elements) for even higher orders is straightforward. A description of Boolean n-cubes is found, for example, in "The Connection Machine," by W. D. Hillis, Scientific American, June 1987, pp. 108-115.

Each cluster in the FIG. 1 system comprises an interface node to the n-cube, a number of processing elements with associated memories, and an interconnection switch.

In operation, a simulation task to be performed by MARS is down-loaded from host processor 11 to the clusters via bus 25. Bus 25 provides direct access to the memories present in the clusters, and the protocol for communicating data across bus 25 is the normal DMA (direct memory access) protocol. Buses 12-24, on the other hand, communicate in messages. Each message consists of a header word followed by between 1 and 16 data words, and each word in our embodiment is 16 bits long. Each word may comprise preselected fields of information in different bit increments. The header word specifies the message length, the cluster address, and the particular processing engine within the destination cluster for which the message is destined. The cluster address is necessary because the n-cube provides connection only to neighbor clusters. When a connection to other than a neighbor cluster is desired, a "daisy chain" connection through a number of node interfaces may be needed.

Figure 2:
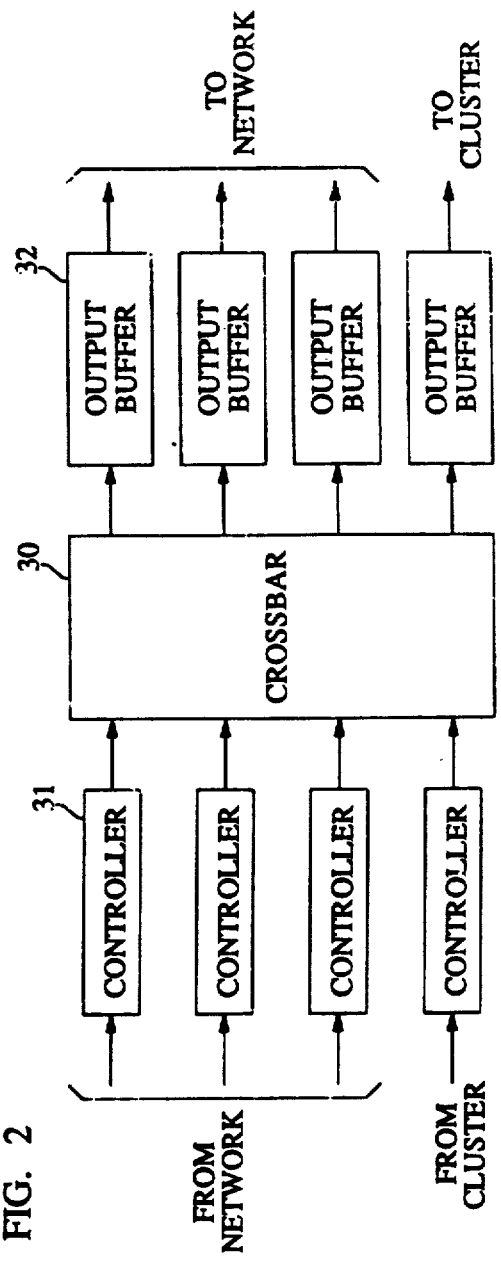
FIG. 2 depicts the general structure of each node.

FIG. 2 depicts the cluster node interface between the processing elements and the n-cube interconnection network, where n is 3. It includes a crossbar switch 30 with 4 inputs and 4 outputs, an input controller 31 connected to each input, and an output buffer 32 connected to each output. One input-output pair is assigned to interface with the processing elements at the node, while the other three input-output pairs are used to route signals along the n-cube interconnection network. The input controllers are conventional address computation circuits, with each being aware of its own address (the address of the node at which the controller resides). A controller reads the desired cluster address of an incoming message, computes the preferred output link to which the message should be switched by comparing the desired address with its own address (bit-wise exclusive OR), and applies the resulting routing information to crossbar switch 30 together with the message. Buffer 32 serves to insure that messages are queued if the destination cluster is busy or a link on the desired path is blocked.

Figure 3:
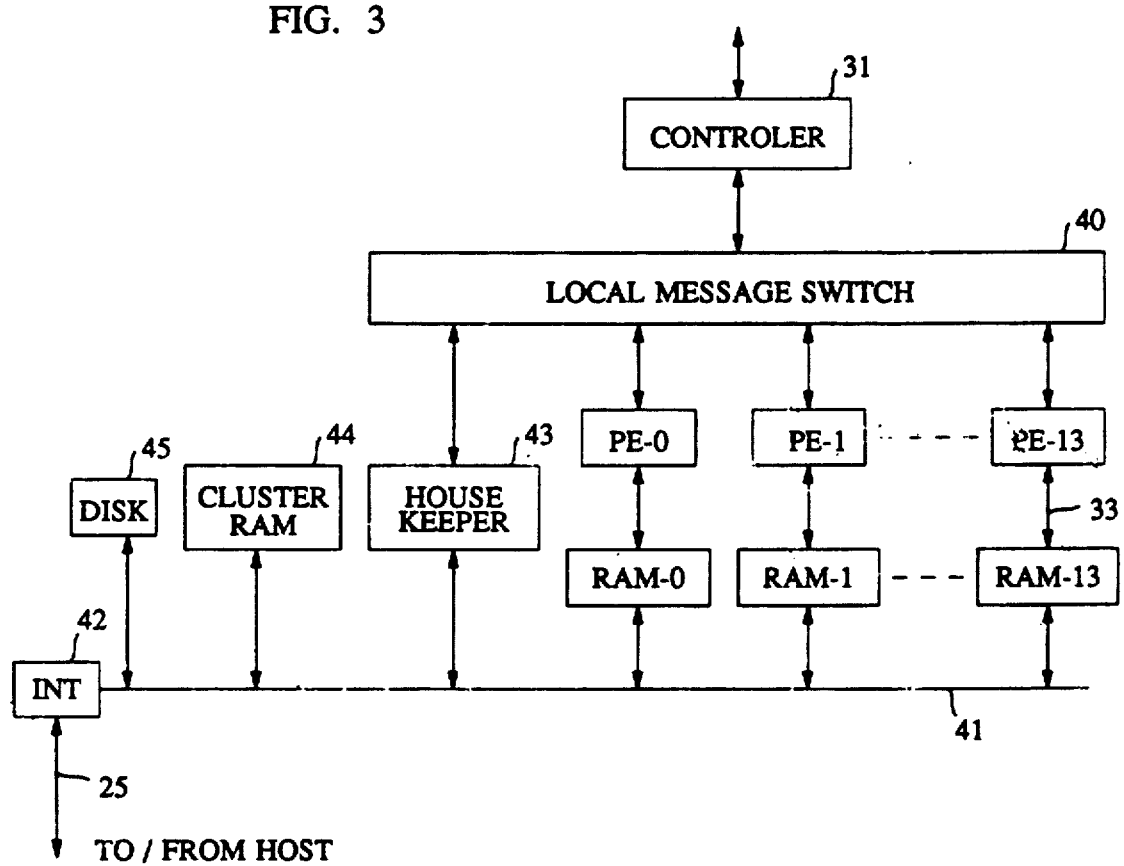
FIG. 3 is a block diagram depicting the processing elements that make up a cluster and the local message switch that interconnects the processing elements.

FIG. 3 presents the architecture of clusters 10 found in FIG. 1. The FIG. 3 arrangement includes 14 processing elements (PE-0 through PE-13), with each processing engine including an associated random access memory (RAM-0 through RAM-13). Each PE communicates with its associated RAM through a dedicated bi-directional bus (e.g., 33) and, in addition, each PE communicates with switch 40. The RAMs also communicate with a bi-directional bus 41 which, through interface circuit 42, communicates with host processor 11 via bus 25. Thus each PE/RAM set is connected both to bus 41 and to switch 40. Also connected to bus 41 is a housekeeper block 43, cluster RAM 44, and a local disk memory 45 for mass storage. Block 43 is also connected to switch 40. Finally, switch 40 is also connected to controller 31 which connects the cluster to the n-cube network.

Figure 4:
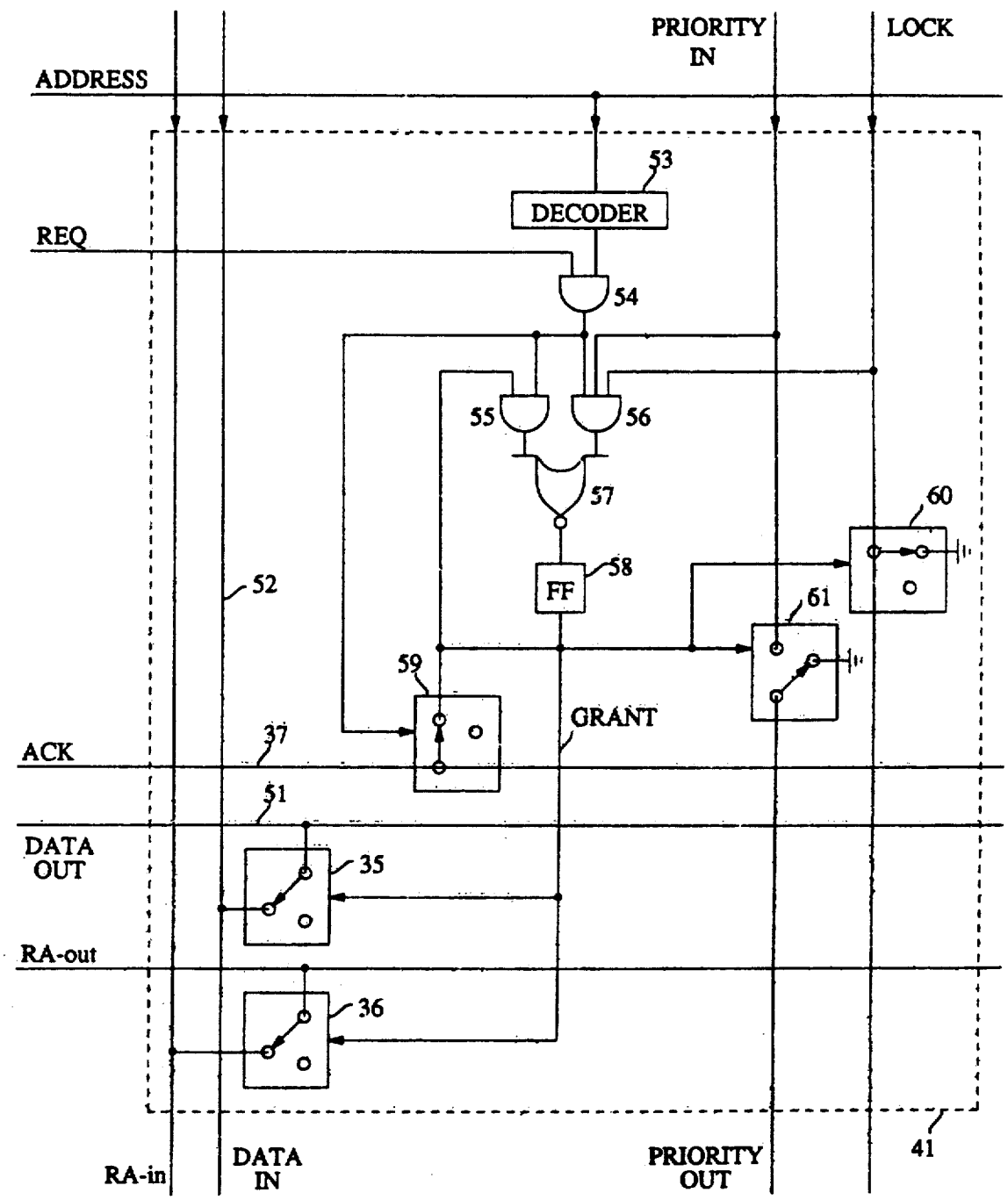
FIG. 4 is a detailed block diagram of the local message switch depicted in FIG. 3.

Switch 40 is the local message switch that connects the PEs with the housekeeper block and the network interface. It is a crossbar arrangement of crosspoint switches (41), as shown in FIG. 4. More specifically, FIG. 4 depicts one of the sixteen data lines from a (source) PE along a row (line 51), one of sixteen data lines from another (destination) PE along a column (line 52), and one crosspoint 41 that connects the source to the destination. In addition to the data lines, the source PE presents four address lines, an output request (REQ) line, an acknowledge line (64), and a request/acknowledge-output line (RA-out). The destination PE includes a request/acknowledge-input line (RA-in) to correspond to the RA-out line. Each column of crosspoints 41 also includes a priority line and a lock indication line. The priority line sets up the priority assignment for the PE's so that, in cases of conflict, a decision can be made as to which source PE should gain access to a desired destination PE in preference to some other source PE. The lock indication line makes sure that once a source PE obtains access to a destination PE, that access is maintained until the source PE chooses to relinquish the connection.

In operation, the address lines are decoded within each crosspoint 41 in the row by prewired decoder 53. At the appropriate crosspoint, the decoded address enables the REQ line (in gate 54) and a signal is sent to gates 55 and 56. The outputs of gates 55 and 56 are applied to gate 57 which is latched to develop the GRANT signal. The GRANT signal is applied to gate 55, and thus when the GRANT signal is high and a REQ pulse appears, that pulse is communicated to latch 58 via gates 55 and 57, where it is captured to maintain the GRANT signal at its high state. When the GRANT signal is not high, gate 55 is disabled.

Gate 56, in addition to being controlled by gate 54, is controlled by the lock indication line and by the priority line entering crosspoint 41. As long as the entering priority line is high (which means that no higher priority PE seeks connection), and as long as the lock indication line is high (which means that no other PE has an established connection), the REQ pulse reaches latch 58 through gate 56 regardless of gate 55, and the GRANT signal is latched high. The priority line exits crosspoint 41 through switch 61. Switch 61 connects the priority line output either to the priority line input or to ground, depending on whether the GRANT signal is high or low. Grounding the priority line prevents subsequent crosspoints on the column from being given the GRANT signal. Somewhat similarly, the lock indication line is shunted by switch 60. It is forced to ground level when any crosspoint 41 in a column has been given a GRANT signal, and that prevents all other crosspoints in the column from obtaining a GRANT signal.

When a GRANT signal is awarded to a crosspoint 41, the REQ signal output of gate 54 passes that information back to the source PE as an acknowledgement signal on line 37. Also, the data line of the source PE is connected to the data line of the destination PE through switch 35, an the RA-out line is connected to the RA-in line through switch 36.

Switches 60, 61, 35, 36 are shown in FIG. 4 in the mode corresponding to the GRANT signal being high.

The RA-in and RA-out lines are shown in FIG. 4 as single lines that are interconnected via switch 36. Functionally, they can be viewed as four unidirectional lines, although in practice their function can be realized with one line, some latching in switch 36, and a two phase clock. The RA lines serve to allow communication between the source and the destination PEs. In operation with a single line, during the first phase of the clock the source PE sends a signal on the RA-out line that informs the destination of a message being sent. Concurrently, the RA-in sends a signal to indicate whether the destination PE has room in its input queue or not. During the second clock phase, the RA-out signal reaches the RA-in line of the destination PE, where it is used to write the sent information into the input queue (when there is room in the input queue). Concurrently, the fact that there was room in the queue and the data was accepted reaches the source PE, where it is used as an acknowledgement of the message reception.

The PEs perform the circuit simulation in our hardware accelerator. Each PE is programmed to act as one stage of a simulation pipeline that includes a number of logically separable units, such as the event scheduler, fanout list processor, function evaluation unit, etc. Housekeeper block 43 is a conventional microprocessor, such as the Motorola M68020. It is basically responsible for loading the simulation information into the PEs (circuits and I/O vectors) and for handling exceptional circumstances, such as restarting the tasks from a checkpoint, after a system crash. The housekeeper can access the local memory of each PE in the cluster, directly via bus 41, and can also send messages to PEs via switch 40. The housekeeper uses disk 45 to store circuit partitions.

Figure 5:
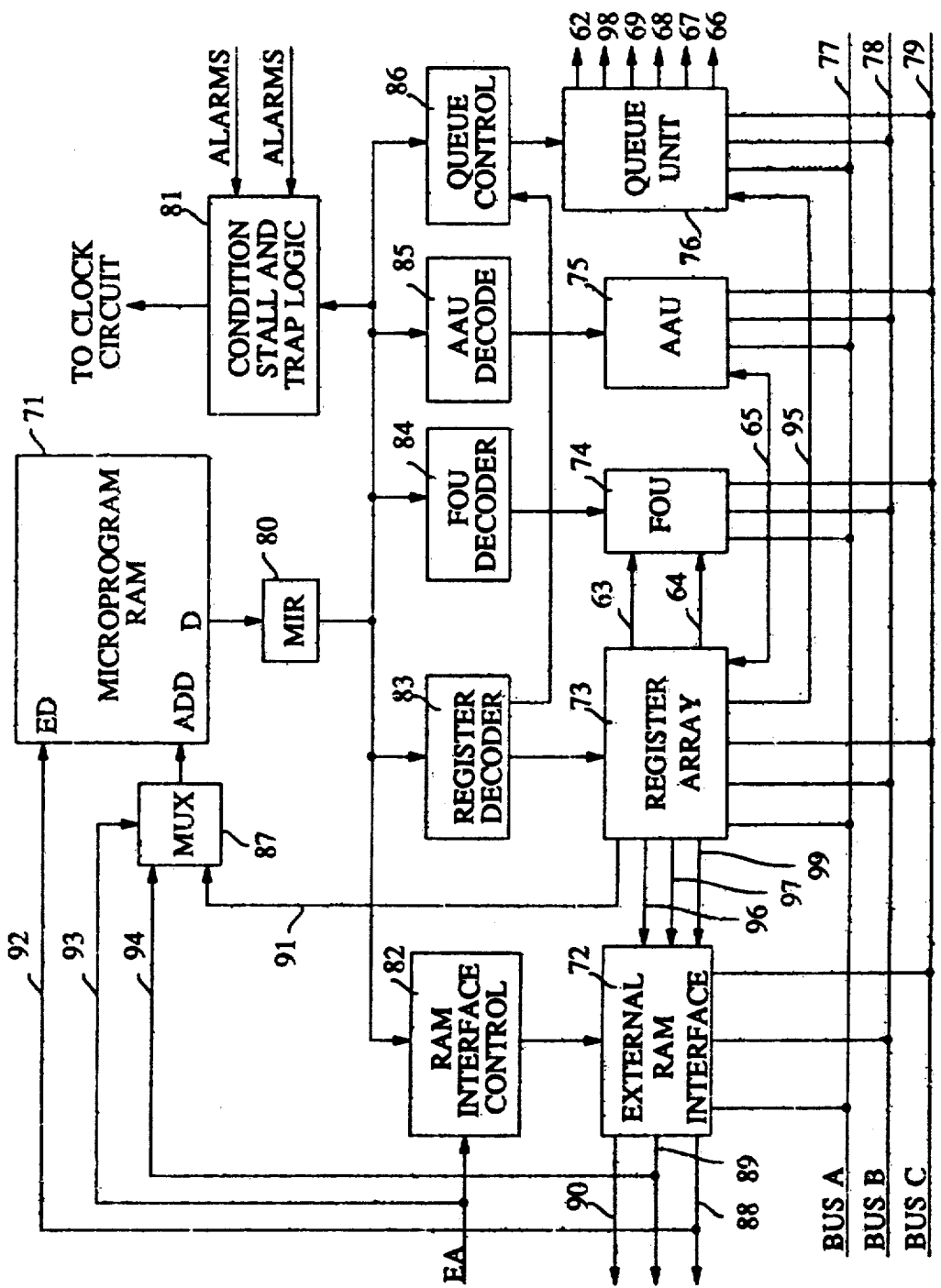
FIG. 5 is a detailed block diagram of the processing elements themselves; and logic.

One of the most important attributes of our accelerator is reflected in the fact that all of the PEs in the cluster are of identical architectural design and that each PE is a microprogrammable processor specialized to act as a pipeline stage for solving application problems. Its architecture, shown in FIG. 5, comprises a microprogram RAM 71 that distributes instructions through register 80 to decoder units 82–86. Units 82–86, in turn, control units 72–76, which are external (data)

RAM interface unit 72, a register array unit 73, a field operation unit (FOU) 74, an address arithmetic unit (AAU) 75, and a message queue unit 76.

Programs are loaded into RAM 71 from external sources via data bus 92 (16 bits) and address bus 93 (also 16 bits). The address bus passes through multiplexer 87 under control of a signal appearing on External Access line 94. In addition to being connected to multiplexer 87, line 94 is connected to RAM interface control 82. Its function in connection with block 82 is to isolate RAM interface 72 from externally applied signals when RAM 71 is being loaded. During normal operation, microinstruction RAM 71 delivers a 64 bit microinstruction to register 80. The 64 bits comprise a plurality of fields which are distributed by Register 80 to various units: to wit, condition stall and trap logic block 81, RAM interface control block 82, register decoder 83, FOU decoder 84, AAU decoder 85, and Queue decoder 86. Elements 82-86 decode the received fields and apply appropriate control signals to elements 72-76, respectively, as described in more detail below. Block 81 is also responsive to various alarm signals such as the Q EMPTY and Q FULL signals from queue unit 76 and its function is to alter the PE's normal operation when an alarm occurs. For example, when queue 76 is full and a write command occurs, block 81 disables the last phase of the clock to prevent such writing.

Units 72-76 communicate over 16-bit buses 77, 78, and 79 in microinstruction cycles which consist of three phases. During phase 1 data is read from registers in unit 73 onto the buses. The function units AAU (75) and FOU (74) operate on the data during phase 2 and drive their results onto the buses during phase 3. The contents of the buses are written to selected registers during phase 3.

Register array 73 contains 32 registers (R0-R31). Most can have their contents gated and applied to any of the three buses during phase 1 of the clock. The signals on any of these buses can be stored in these registers during phase 3 of the clock. Some registers serve additional purposes such as addressing a memory, acting as a port into the memory or message queues, or configuring a function unit.

Before proceeding with the description of the various special registers in register array 73, it may be noted that the parallel architecture of the PE—which is characterized by having various units that can communicate with each other through different paths, and with respect to some units through parallel paths —suggests the use of more than one register for a particular function so that the available parallelism is better utilized. For this and other reasons that will become apparent, many of the functions described below are served by two registers in array 73.

Registers R2 and R3 in register array 73, for example, are the program address registers, and they are used to address RAM 71 via path 91. The two registers are provided for two purposes. First, so that while one register is directing RAM 71 to retrieve data, the other register can be loaded with the next RAM 71 address (or merely incremented to sequence through the program). Second, in branching situations both addresses can be loaded with the target addresses so that when the branching decision is reached, no clock cycles are consumed to determine the next RAM 71 address. In other words, fast branching is accomplished without the use of any of the communication buses. Whether R2 or R3 is applied to bus 91 is controlled by decoder 83. Bus 91 communicates the address to RAM 71 through multiplexer 87 which, as described above, selects bus 94 during the loading process, but under normal operations selects bus 91.

Data RAM interface unit 72 is addressed by the concatenation of two registers. Register R0 or R1 provides the 16 least significant bits of the address on line 99, while register 10 or 11 provides the 8 significant bits of the address on line 96. The 24 bit address provided by lines 99 and 96 are applied, in the appropriate circumstance, to lines 89 and 90, respectively, at the output of interface unit 72. Data is transferred between bus 88 and buses 77, 78, and 79 in response to signals from control unit 82. Register array 73 also provides a signal to external RAM interface unit 72 on bus 97. Bus 97 emanates from the memory select registers R6 or R7 in array 73, and the signals on this bus control the RAM interface unit (72) to configure the effective "aspect ratio" of the external memory. That is, line 97 controls interface unit 72 so that a given external memory connected to line 88-90, such as a 64K word memory of 16 bits each can appear to the PE as if it were 64K words of 16 bits each, 1M words of 1 bit each, or any other aspect ratio in between. Using the 24-bit address (lines 99 and 96), the external memory associated with the PE is accessed for reading and writing purposes as if it were register R29 in register array unit 73. Memory can be read or written each cycle, but memory addresses must be set up appropriately.

Queue unit 76 is actually two units: a 4 word input queue, and a 4 word output queue. Both are circular FIFO memories and both are addressed as register 31. Register R14 in array unit 73 provides the message destination address to queue unit 76 directly through line 95. This address is delivered to bus 62 at the output of queue unit 76 at the same time as the message data is delivered to bus 98. The RA-in and RA-out signals are also delivered by queue unit 76, on lines 66 and 67, and together these lines are sent to local message switch 40. The Q EMPTY and Q FULL lines (68 and 69) are the alarm signals connected to block 81, which indicate whether the output queue is full, or the input queue is empty, respectively. Thus, writing to R31 transmits a message to the output queue, while reading from R31 receives a message word from the input queue.

Register R30 in register array unit 73 is non-existent, so this address provides an information sink for unwanted data. This capability is included because it enables the instructions to always be couched in terms of a source address and a destination address.

A still additional special register that is available in register array 73 is the field select register (FSR), which is register R4 or R5. This register configures field operation unit 74 via bus 63 by selecting the width and starting bit position of its input and output bit fields.

FOU unit 74 performs bit field operations. That is, it extracts bit fields from its two source operands, operates on these bit fields and then inserts the result into a field of one of its operands, or to still another field on one of the output buses. The FOU operations include ADD, SUBTRACT, INCREMENT, DECREMENT, NEGATE (arithmetic), AND, OR, XOR, NOT, MAX, and MIN. The FOU accelerates simulation applications by providing fast operations on packed structures where several independent fields are packed into the same word. In a single cycle the FOU can extract fields from two words, operate on them and insert the result back into a word. The possible field widths are 1, 2, 4 and 8 bits. It may be noted that from the grouping of buses A, B and C, the FOU is connected only to buses A and B. The FOU, however, is also connected to bus 63 from register array 73 wherein registers R4 and R5 may be accessed.

The FOU may also take one of its inputs from a special register in array 73, rather than from a bus. The FOU can access register R15 via bus 64. This permits one more bus related operation at the same cycle.

Figure 6:
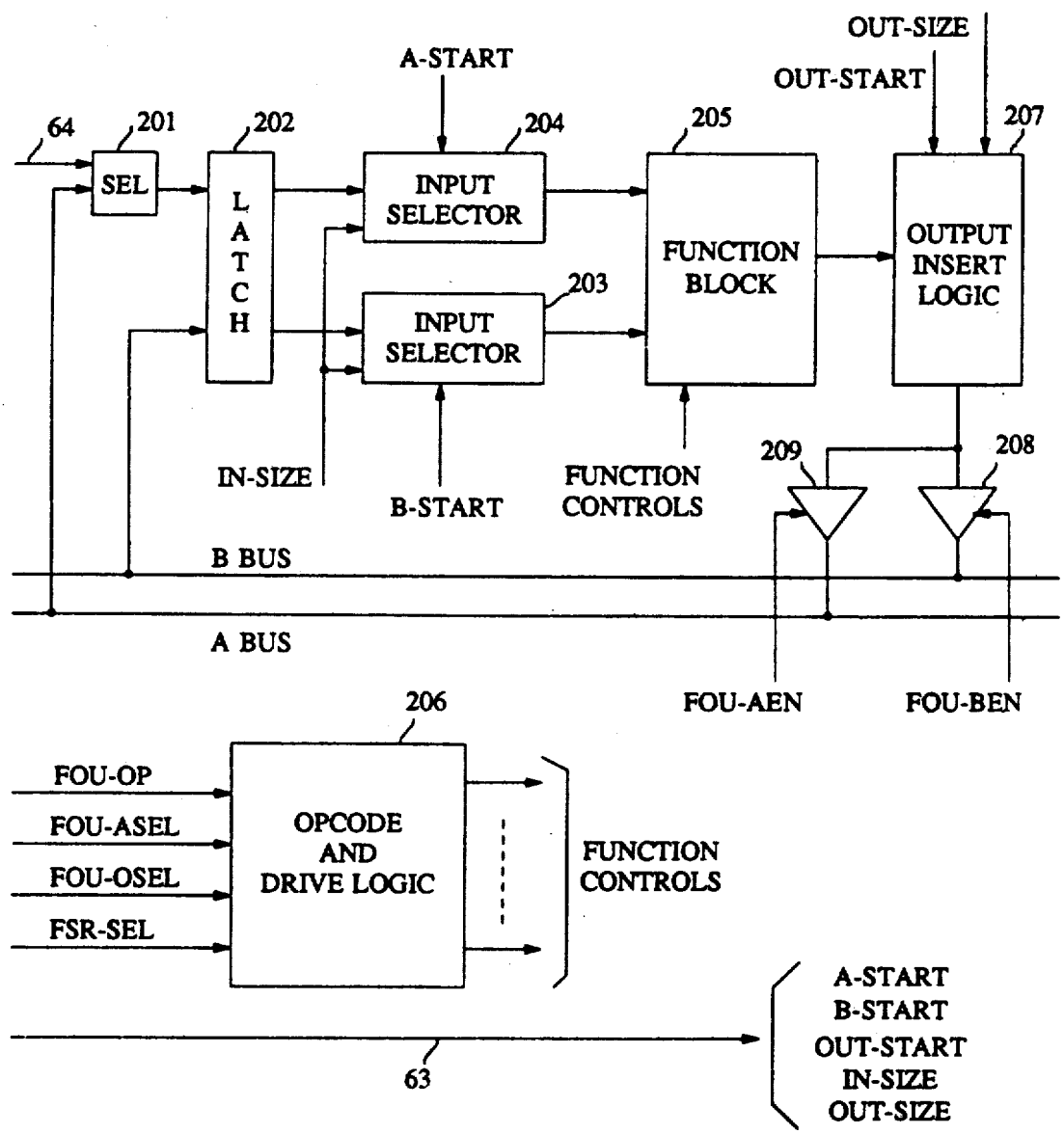
FIG. 6 presents a block diagram of the FOU unit.

FIG. 6 presents a block diagram of the FOU unit. One input to the unit comes from decoder 84 and it comprises the FOU-OP 4 bit bus which specifies the desired operation that is to be performed; the FOU-ASEL line, which determines the source of the first operand—the A bus or the bus connected to register R15 (bus 64); FOU-OSEL line which specifies the destination bus; and the FSR-SEL line which specifies whether register R4 or R5 is employed to deliver signals to bus 63. Bus 63 provides the A-START, B-START, OUT-START, IN-SIZE, and OUT-SIZE control signals that are used throughout the circuit. The other inputs to the FOU unit come from the A bus, the B bus, and bus 64.

The A bus and bus 64 are applied to selector 201, where one is selected under control of the FOU-ASEL signal. That output of selector 201 and the B bus are applied to latch circuit 202 that is controlled by the first phase of the basic clock. That latched B bus is applied to input selector 203 while the other latched bus is applied to input selector 204. Selectors 203 and 204 extract the desired field under control of the IN-SIZE control signal and the A-START and the B-START control signals. The latter determine the starting bit of the extracted field while the former determined the field length (1, 2, 4, or 8 bits).

The outputs of selectors 203 and 204 are applied to function block 205, which implements all of the above identified FOU operations (e.g., ADD and INCREMENT). These operations are performed under control of function control signals that are derived from opcode and drive logic block 206. Block 206 is responsive to signals provided by decoder 84 and it comprises conventional combinatorial logic. Function block 205, likewise, comprises conventional combinatorial logic. The output of function block 205 is applied to output insert logic 207. In response to control signals OUT-SIZE and OUT-START block 207 inserts the field developed by block 205 in the desired location and forwards it to output selectors 208 and 209, which in response to control signals FOU-AEN and FOU-BEN from decoder 84 forwards the output to the A BUS (77) and B BUS (78), respectively.

In contradistinction to the FOU which operates on a field of different lengths, the AAU unit (75) performs 16-bit arithmetic. Two source operands, A and C, are read from designated registers, the queue unit 76 and/or RAM interface 72 onto the A bus (77) and C bus (79) during phase 1. These are inputs to the AAU. The result of the AAU operation is returned to the C bus in phase 3. The AAU instructions include ADD, SUBTRACT, INCREMENT, DECREMENT, MULTIPLY, DIVIDE, NEGATE (arithmetic), AND, OR, XOR, NOT, BIT TEST, BIT SET, BIT CLEAR, and ROTATE.

The AAU may also take one of its inputs from a special register in array 73, rather than from a bus. The AAU can access register R13 via bus 65. This permits one more bus related operation at the same cycle.

Register writes during phase 3 can be made conditional on the result of an AAU operation performed during phase 2. This is the only conditional execution mechanism in the PE. A conditional branch is performed, as described above, by writing the target addresses to two registers.

Figure 7:
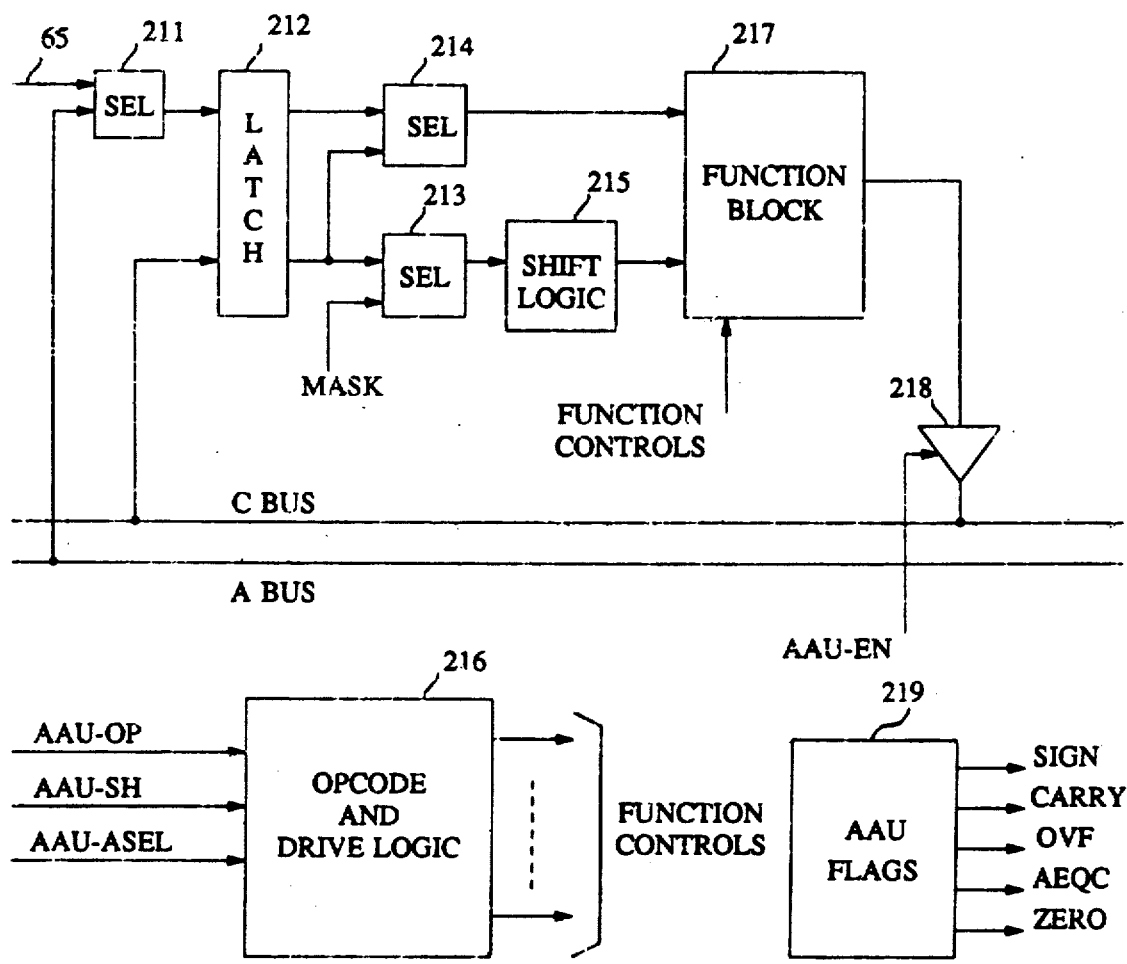
FIG. 7 presents a block diagram of the AAU unit.

FIG. 7 presents a block diagram of address arithmetic unit 75. One input to the unit comes from decoder 85 and it comprises signal AAU-OP, which specifies the operation to be performed; signal AAU-SH, which specifies the shifting; and signal AAU-ASEL, which specifies whether the A bus or the bus connected to register R13 (bus 65) is selected.

Bus 65 and the A bus are connected to selector 211 which is controlled by AAU-ASEL signal. The selected bus is applied to latch 212, as is the C bus. The latched C bus is connected to selectors 213 and 214, and the latched A bus (or bus 65) is connected to selector 214. The output of selector 213 is connected to a shift logic block 215. Block 213, 214, and 215 serve to implement the BIT TEST, BIT SET, and BIT CLEAR operation of the AAU, as well as the SHIFT and ROTATE operations of the AAU. The bit manipulation operations are realized by employing masks that are generated in response to the control signals and the 4 least significant bits on the A BUS (which are applied to OPCODE and Drive Logic block 216). Logic block 216 is also responsive to the aforementioned decoder 85 output signals and develops control signals applied to function block 217. Function block 217 receives input signals from selector 214 and shift logic 215. It performs the remaining AAU operations enumerated above. The functions are realized with conventional combinatorial logic. Finally, the output of block 217 is applied to output selector 218, which is responsive to the AAU-EN signal from decoder 85. Block 217 also supplies information to block 219 which ascertains the presence of specific flag conditions. These conditions affect the AAU-EN signal. These flags are the AAU-SIGN, which indicate the signal of the operation result; the AAU-CARRY, which is the AAU carry indicator; the AAU-OVF, which is the overflow indicator; the AAU-AEQC, which indicates the buses A and C carry the identical information; and the AAU-ZERO, which indicates the operation result is zero.

The microprogram RAM (71) provides microinstructions that control each part of the data path. Each cycle, the selected program address register is used to read the microinstruction to be executed during the following cycle.

The 64-bit PE microinstructions have two formats: constant or normal. Constant microinstructions place two 16-bit constants on buses A and B and can be used to load constants into registers; however no AAU or FOU operations can be performed during a constant instruction. Normal microinstructions are used in all other cases and contain fields that specify:
1. Source registers and destination registers for each of the three buses. A short (5-bit) constant can also be placed on bus A directly from the microinstruction.
2. AAU and FOU operations.
3. Addresses register selection.
4. Trap enables.
5. Condition selection and sensitization of each bus to the condition.

In using the MARS as a multiple delay logic simulator, up to 64K gates can be handled by each cluster. In applications where more than 64K gates exist, more than one cluster can be employed, in accordance with FIG. 1, with each cluster being devoted to the simulation of a preselected portion of the circuit. Of course, the circuit partitioning would be selected so that the communications between clusters is minimized.

The simulations within a cluster are performed in a sequence of time steps and in two simulation phases: fanout and evaluation. During the fanout simulation phase, events occurring at the current time step are propagated to the inputs of gates, and the gates are scheduled for evaluation. During the evaluations phase these gates are then simulated. Use of the two simulation phases prevents multiple evaluations of a single gate in a single evaluation cycle. All gate inputs are updated before a gate is evaluated and the gate is evaluated only once. Thus, this design supports event cancellation for inertial delay models.

Figure 8:
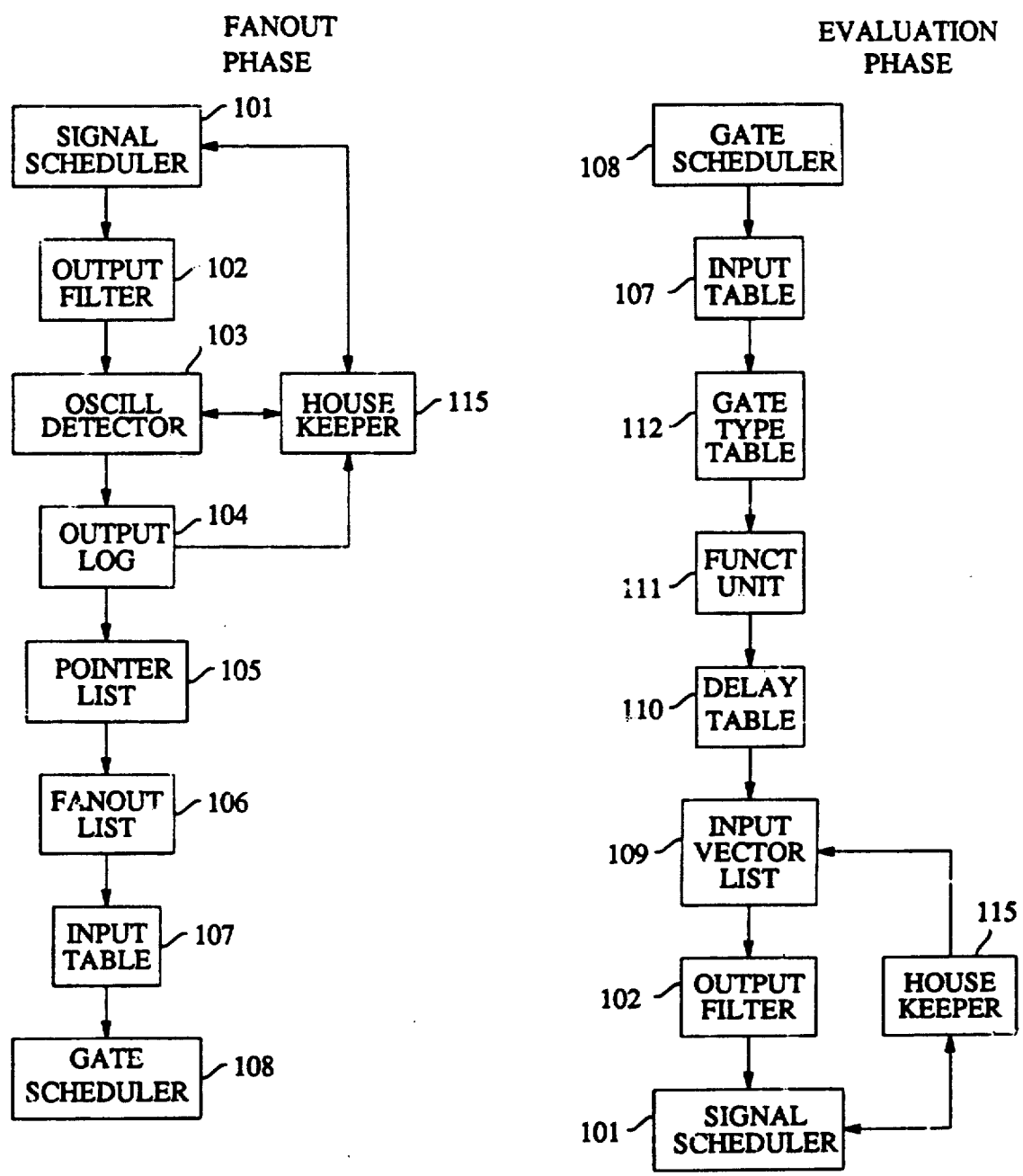
FIG. 8 illustrates the use of a cluster to implement logic simulations.

The major structure of the simulator is shown in the flow chart of FIG. 8, where a separate pipeline is shown for each of the simulation phases. Each block in FIG. 8 represents a processing element in a cluster (save for housekeeper block 115 which is housekeeper block 43 that is shown in FIG. 3). The interconnection of the blocks is accomplished through the local message switch (40) and, hence, the alternating switching from the fanout arrangement at the left portion of FIG. 8 to the evaluation arrangement at the right portion of FIG. 8 is easily accomplished, as described below. As can be seen from perusing through FIG. 8, each PE is used at most once per simulation phase, and some of the PEs are used in both simulation phases. Description of the fanout phase pipeline and the evaluation pipeline follows; but observing generally, the simulation proceeds by alternating between the two phases.

The first block in the fanout phase is signal scheduler 101, which schedules changes in signal values. It begins simulation when the housekeeper sends a cycle count which indicates the number of time steps that are to be simulated. A cycle count register (one of the registers in array 73) keeps track of the number of time steps remaining before the simulation is terminated, whereupon control is returned to the housekeeper. The signal scheduler data structure consists of a table containing pointers to link lists of events. When simulation begins, the signal scheduler enters the evaluation mode (described below) and schedules events. Upon receiving a zero message, the signal scheduler begins the fanout simulation phase by first decrementing its time step count. While the count is not zero, the signal scheduler sends to output filter block 102 the current time and gate identifier messages concerning all gates scheduled for the current time. After the last gate message has been sent, a zero message is sent down the pipeline to begin the evaluation phase. When the time step count reaches zero, control reverts to housekeeper 115.

Output filter 102 keeps track of current and pending signal values and performs event cancellation as required. In the fanout simulation phase the output filter forwards the time message to oscillation detector block 103 and process the gate messages. For each gate message, the output filter determines whether the most recent event on the gate output is scheduled for the current time step. If it is scheduled, the pending value is looked up and a two word message containing the gate number and the pending value is sent to oscillation detector block 103. Otherwise, the event is canceled. Receipt of a zero message from the signal scheduler toggles the output filter back to the evaluation mode.

Oscillation detector block 103 detects zero delay oscillations. This condition may occur when a feedback path exists in a simulated circuit. When an oscillation condition is detected, block 103 sends and interrupt signal to housekeeper 115 where a specific subroutine is initiated to communicate an exception to the user (host) via interface 42 and bus 25 (FIG. 3).

Oscillation detector 103 merely keeps track of zero delay oscillations; by insuring that a preselected oscillation count is not excluded. It also communicates its input signals to output log block 104.

Block 104 records events on signals that are being watched. Those signals are identified by a bit vector (1 bit per gate) that identifies the desired gate outputs.

Pointer list block 105 receives the gate value messages from output log 104, looks up a pointer in the gate's fanout list, and passes the pointer and the value along to fanout list 106. The pointer is 18 bits.

Fanout list block 106 takes the pointer 106 and value message from the pointer list and uses the pointer to look up the fanout list for the gate. Each fanout entry consists of a gate and input number pair. For each fanout, the value from the input message is appended to the entry to form a gate input and value message that is sent on to input table 107.

Input table block 107 maintains a list of input values for each gate. When it receives a gate, value and input message from the fanout list, it updates the table accordingly and sends a message containing the gate identifier to gate scheduler 108.

Gate scheduler block 108 schedules gates whose inputs have changed for evaluation. For each message received from the input table, the gate is checked to see if it is already scheduled, and if not, it is pushed on a scheduling stack. A bit vector is used to keep track of scheduled gates.

A zero message propagating down through blocks 101-108 starts the evaluation phase by causing the gate scheduler (see upper block in right portion of FIG. 8 to send its scheduled gates to the input table.

For the evaluation phase (right portion of FIG. 8), the gate scheduler pops scheduled gates off its stack, marks the gates as not scheduled, and sends gate messages on to input table block 107. When the last gate is popped off the stack, a zero message is sent to the input table.

The input table receives gate messages and looks up the current input values for the gate. For each gate message received, a two word message containing the gate identifier and its input values is sent on to the gate type table 112. A zero message toggles the input table back to the fanout phase.

The gate type table looks up the gate type and appends this information to the message received from the input table. The resulting two word message is sent on to function unit 111.

Function unit block 111 simulates the designated gate function unit uses the gate type and the input values in the incoming message to compute the output value produced by the gate. The resulting output value, along with the gate identifier, is forwarded to delay table 110.

Delay table 110 looks up the proper delay, depending on the gate and direction of signal change. The determined delay is appended to the gate value message and passed on to the input vector list block 109.

Input vector list block 109 converts delay to time and passes messages to the output filter (102). It then checks if the current time has advanced to the last time for which an input vector was scheduled. If the current time is greater than or equal to this vector time, the next scheduled vector is inserted in the message stream and passed on to the output filter.

The output filter determines whether the result of the gate evaluation has changed the value of the gate output. If it has, the output filter logs the pending event, and sends a gate and time message to the signal scheduler.

The signal scheduler schedules events received from the output filter. A zero message starts the next fanout cycle, provided that the cycle count is not zero.

What is claimed is:

1. A programmable logic simulation accelerator comprising:
    a plurality of programmable processing elements; and
    a communication network for transferring information to and from said accelerator and between any one of said plurality of processing elements
    with each of said plurality of processing elements including
    a plurality of data buses
    an input and output block for communicating messages between said plurality of data buses and said communication network, and
    a field operation unit responsive to signals on said plurality of data buses for selecting a first chosen field from one of said plurality of data buses and a second chosen field from another one of said plurality of data buses, operating on the first and second chosen fields and placing a result in a preselected field on one of said plurality of data buses.

2. A processing element in accordance with claim 1, further including stall means for suspending selected operations when said queue is empty or full.

3. A processing element in accordance with claim 1, further including a memory and means for configuring said memory to any desired word width.

4. The accelerator of claim 1, further comprising:
    an associated memory connected to each of said processing elements memory;
    a common bus for interconnecting said memories; and
    a common memory connected to said common bus 5. The accelerator of claim 4, further comprising a housekeeping processor interposed between said common bus and said communications network.

6. The accelerator of claim 1 further including means for designating said chosen field selected by said field operation unit from said one bus and said field chosen by said field operation unit from said another bus.

* * * * *